United States Patent [19]
Hoffmeyer

[11] Patent Number: 6,127,731
[45] Date of Patent: Oct. 3, 2000

[54] CAPPED SOLDER BUMPS WHICH FORM AN INTERCONNECTION WITH A TAILORED REFLOW MELTING POINT

[75] Inventor: Mark K. Hoffmeyer, Rochester, Minn.

[73] Assignee: International Business Machines Corporation, Armonk, N.Y.

[21] Appl. No.: 09/266,586

[22] Filed: Mar. 11, 1999

[51] Int. Cl.[7] .......................... H01L 21/44; H01L 23/48
[52] U.S. Cl. ..................... 257/750; 438/614; 438/615; 438/658; 438/660; 438/661; 257/737; 257/738
[58] Field of Search .................................... 438/615, 597, 438/612, 613, 614, 658, 660, 661; 257/690, 737, 738, 741, 750, 762, 772

[56] References Cited

U.S. PATENT DOCUMENTS

| | | |
|---|---|---|
| 5,391,514 | 2/1995 | Gall et al. . |
| 5,729,896 | 3/1998 | Dalal et al. ............................. 29/840 |
| 5,776,790 | 7/1998 | Starr et al. ................................ 438/6 |
| 5,794,839 | 8/1998 | Kimura et al. . |
| 5,796,591 | 8/1998 | Dalal et al. . |
| 5,834,366 | 11/1998 | Akram ................................. 438/614 |
| 5,838,069 | 11/1998 | Itai et al. ............................. 257/766 |

*Primary Examiner*—Charles Bowers
*Assistant Examiner*—Evan Pert
*Attorney, Agent, or Firm*—Christopher H. Lynt

[57] ABSTRACT

The melting point of the solder forming a controlled collapse chip connection is tailored by forming a thin metal cap of a metal such as palladium or silver on a solder bump. When the solder bump is melted during reflow, the metal cap dissolves into the solder. Because the resulting alloy has a higher melting point than the solder, subsequent reflow processing does not melt the chip join structure.

28 Claims, 3 Drawing Sheets

CAPPED SOLDER BUMPS WHICH FORM AN INTERCONNECTION WITH A TAILORED REFLOW MELTING POINT

BACKGROUND OF THE INVENTION

1. Field of The Invention

The invention relates to the field of integrated circuit (IC) interconnect systems of the type in which solder bumps are evaporated onto selected locations on a semiconductor chip and, more particularly, to the addition of a thin layer of a metal such as palladium (Pd) or silver (Ag) onto the solder bumps to tailor the resultant melting temperature of bump interconnections made with low melting point solders.

2. Background Information

An electronic device may be formed of an assembly of integrated circuits (IC) chips interconnected to perform the particular device's required transfer of signals. The IC chips communicate with other chips in the device through an input/output (I/O) system of interconnects. A chip may be attached to a single chip module or a multi-chip module. These kinds of modules, which may be nothing more than chip holders or may themselves incorporate active devices, are known as a first level package. The modules are then generally attached to a printed circuit board (PCB) or card. Sometimes chips, without modules, are attached directly to the card. An assembly of chips and/or modules on a card is known as a second level package. These cards may be attached to another card, such as a motherboard, forming what is known as a third level package.

In many cases, the attachment of chips to modules, or modules to cards, is fixed by soldering the connections between the parts. Exposed conductors on one part are placed in close proximity to exposed conductors on another part with a quantity of solder, generally an alloy of tin (Sn) and lead (Pb). The solder is heated until the solder melts, a process called reflow. When the molten solder cools and solidifies, a fixed electrically conductive connection is formed.

In the course of making a final product, requiring a first level assembly process and a second level assembly process, for example, connecting chips to modules and modules to cards, the soldered connections may be exposed to heat sufficient to melt the solder several times. It is important that subsequent heatings do not destroy or significantly degrade the connections formed by earlier processes. This necessary durability can, in some cases, prove problematic.

A flip chip is an integrated circuit chip that is mounted on a substrate without conventional leads and pins. An active surface of the chip, i.e., a side with the input/output (I/O) connections, faces the substrate. A flip chip may be mounted to the substrate with any of a variety of interconnect materials and methods, such as isotropic and anisotropic conductive adhesives, fluxless solder bumps, wire interconnects, metal bumps, compliant bumps or pressure contacts. By eliminating the normal leads and pins found on other IC chips, flip chips generally provide the shortest possible leads, lowest inductance, highest frequency, best noise control, highest density, greatest number of I/O connections, smallest device footprint and the lowest profile.

A known technique for providing electrical interconnections between flip chips and a carrier, i.e. a module or a circuit board, is through the use of controlled-collapse chip connection (C4) technology, in which solder bumps are formed on one surface of the chip at chip interconnect points. These solder bumps are formed in a pattern or array on the chip surface, and a corresponding pattern or array of pads is formed on the carrier. The chip is "flipped" to bring the solder bumps into mating contact with the pads on the carrier. The entire assembly of chips and carrier is then subjected to heat above the melting temperature of the solder, which depending on the composition of the solder may be between 175° C. and 320° C. This causes the solder to reflow and wet the pads so that, upon cooling, a metallurgical bond is formed between the interconnect points and the pads on the carrier. This also insures a good electrical interconnection between the interconnect points and the pads.

Modern electronic packaging applications have continuously required the development of dense, small, high performance, and low cost module and card packages. To achieve these objectives, it may be desirable to incorporate high performance flip chip and controlled-collapse chip connection (C4) integrated circuit (IC) devices onto low cost organic chip carrier board materials such as fiberglass reinforced epoxy (FR4) composites, or other low cost board material systems.

However, most low cost carrier board materials generally cannot withstand prolonged temperature exposures above 230° C. Consequently, both chips and carrier boards must have chip interconnect metallurgies and carrier surface finishes that support low temperature (<230° C.) soldering. Furthermore, the low temperature soldering must provide solder joint reliability with respect to the package design, materials selections, and during any first or second level assembly process exposures.

FIG. 3 depicts a conventional controlled collapse chip connection (C4) according to the prior art. Chip 100 includes an interface region 310 that connects to the chip's circuitry (not shown). A solder bump 320 is deposited on the interface region 310. The solder bump 320 is formed from a lead-rich alloy (97% lead, 3% tin by weight). Conventionally, a connection is formed between chip 100 and carrier substrate 300 by placing the solder bump 320 against the carrier pad 330. In this scenario, chip carrier materials that can withstand temperatures exceeding 270° C.–300° C. are required, because the entire structure must be heated to a temperature sufficient to melt the Pb-rich bump composition. The solder bump 320 wets when heated and forms a metallurgical bond to the carrier pad 330 upon cool down of the assembly and subsequent solidification of the bump-to-carrier pad solder joints.

When the assembly includes organic chip carrier materials, it is often necessary to perform the soldering at a lower temperature (175° C.–230° C.) to avoid damaging the organic materials. Low temperature processes are facilitated by using a carrier substrate 300 which includes a conventional copper carrier pad 330 that has been coated with an application of tin (Sn) or an eutectic composition tin-lead (Sn—Pb) alloy coating. The tin-lead alloy coating acts as a low melting point medium for attach, while a pure Tin coating provides the necessary metallurgical constituent to prompt a low melting point (eutectic) metallurgical reaction between the coating on pad 330, and the solder bump 320. In either case, a connection is formed between chip 100 and carrier substrate 300 by placing the solder bump 320 against the carrier pad 330. The entire structure is heated so that eutectic melting, wetting and subsequent bonding between the solder bump 320 and the coating on pad 330 occurs.

Chips possessing the conventional high lead (Pb) alloy bumps for low temperature solder interconnection processing can be made easier to use by applying metals such as tin (Sn) as caps on solder bumps 320, to eliminate need for a carrier pad 330 coating. For an example of capped bump structures, see U.S. Pat. No. 5,729,896. In this example, when a tin capped bump is placed into position on a carrier pad, a tin-lead liquid composition forms on the surface of the bump after heating to sufficient temperature, which subsequently wets to the carrier pad surface, and forms the solder joint between solder bump and carrier pad upon cool down and solidification.

However, in some manufacturing processes the joined connection is subjected to subsequent heatings, and because the melting point of the solder composition in the interconnection region has not significantly changed as a result of these previously known processes, further applications of heat must be carefully controlled or limited in number to avoid remelting or multiple remelting and solidification cycles. Otherwise, temperature excursions and associated phase transition sequences can potentially degrade the previously established interconnection. As the number of required heatings to manufacture a finished product grows, the need for precise control of the processes may become unmanageable.

Therefore, a need exists for a method of forming an electrical connection between a chip and a substrate, which allows the melting point of bump interconnections that are made with low melting point solders to be appropriately tailored.

SUMMARY OF THE INVENTION

It is, therefore, a principal object of this invention to provide a method and apparatus for an improved C4 chip bump and improved flip chip interconnect structures.

It is another object of the invention to provide a method and apparatus that solves the above mentioned problems by tailoring the resultant melting temperature of bump interconnections made with low melting point solders.

These and other objects of the present invention are accomplished by the method and apparatus disclosed herein.

According to an aspect of the invention, there is provided a metal capping for the C4 solder bumps which increases the resistance of bump interconnections to partial melting in processes requiring multiple heatings.

According to an aspect of the invention, there is provided a metal capping for the C4 solder bumps which supports both module and custom package requirements.

These and other aspects of the invention will become apparent from the detailed description set forth below.

DETAILED DESCRIPTION OF THE PREFERRED EMBODIMENT(S)

The invention will now be described in more detail by way of example with reference to the embodiment(s) shown in the accompanying figures. It should be kept in mind that the following described embodiment(s) is/are only presented by way of example and should not be construed as limiting the inventive concept to any particular physical configuration.

Figure 1:
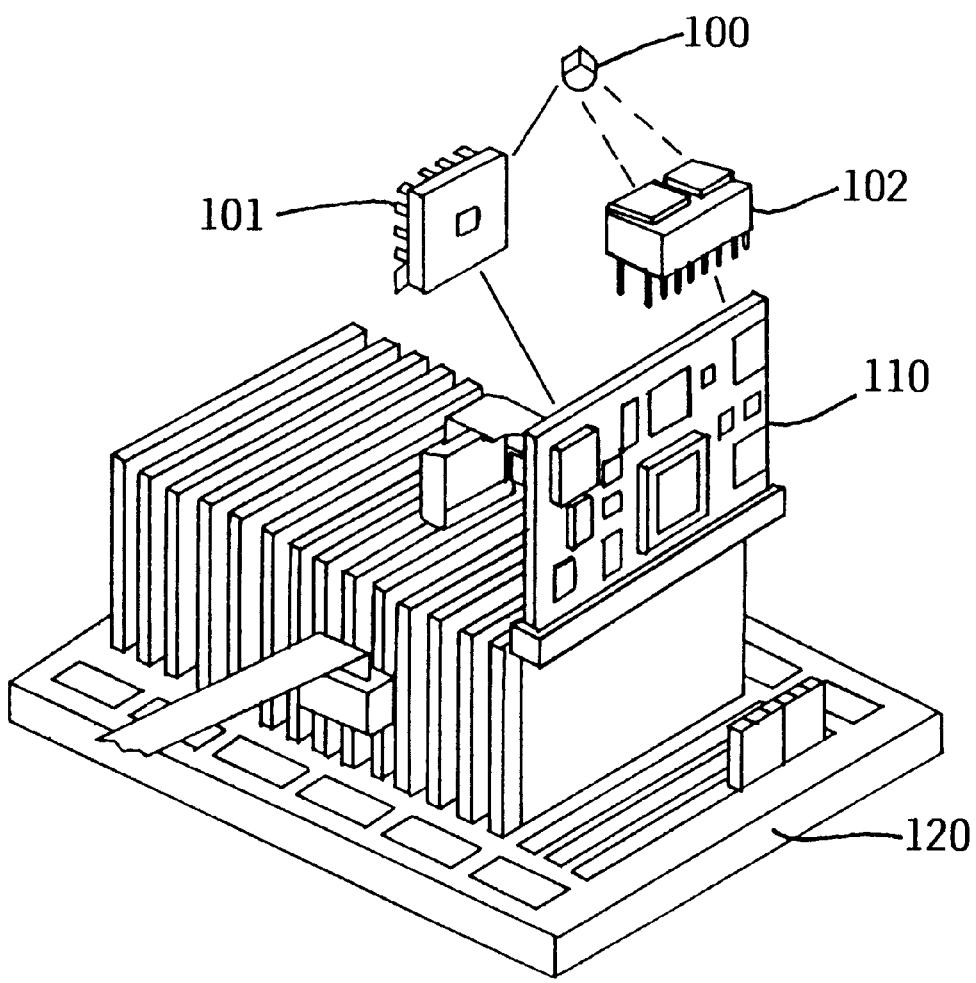
FIG. 1 illustrates the electronic package hierarchy described in the background section, to which the present invention can be advantageously applied.

FIG. 1 shows an exemplary electronic package hierarchy to which the invention can be applied. A chip 100 can be attached at the first level package to a single chip module 101, a multichip module 102, or directly to the second level package or card 110. The card can then be attached to a third level package or motherboard 120.

Figure 2:
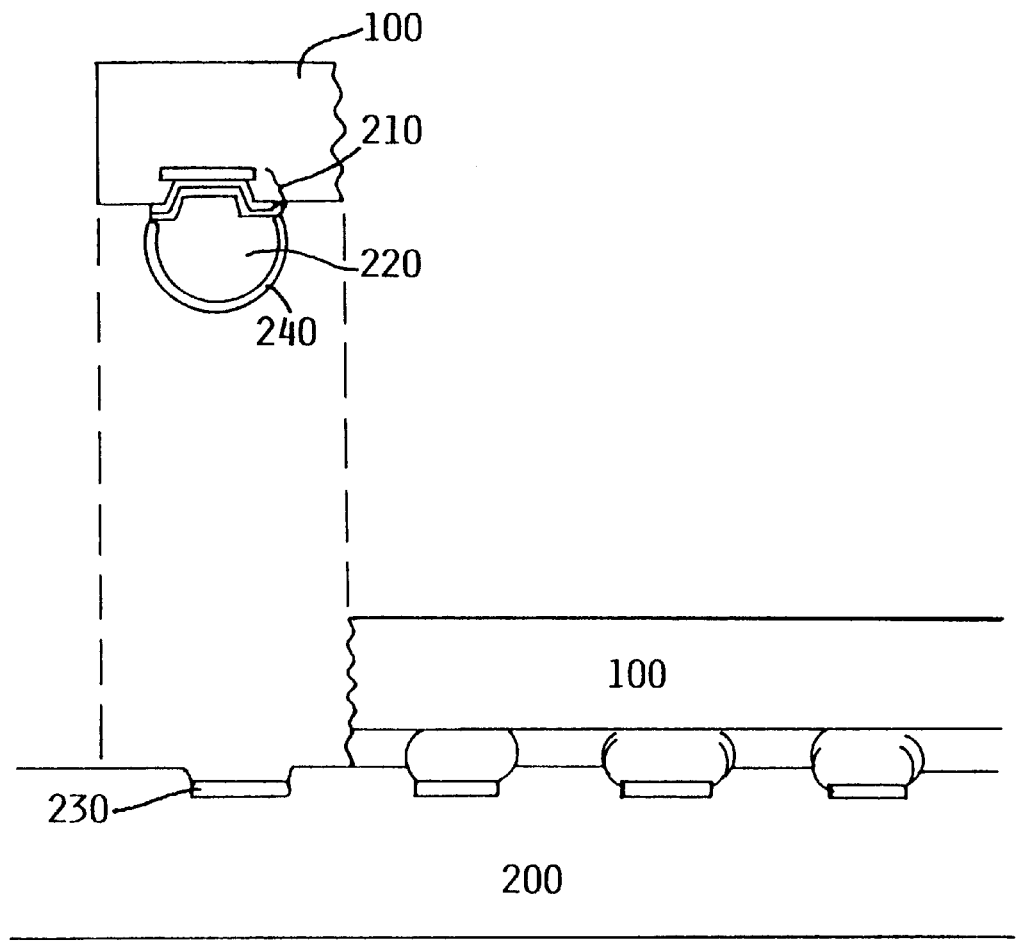
FIG. 2 illustrates a controlled collapse chip connection according to an exemplary embodiment of the invention.
Figure 3:
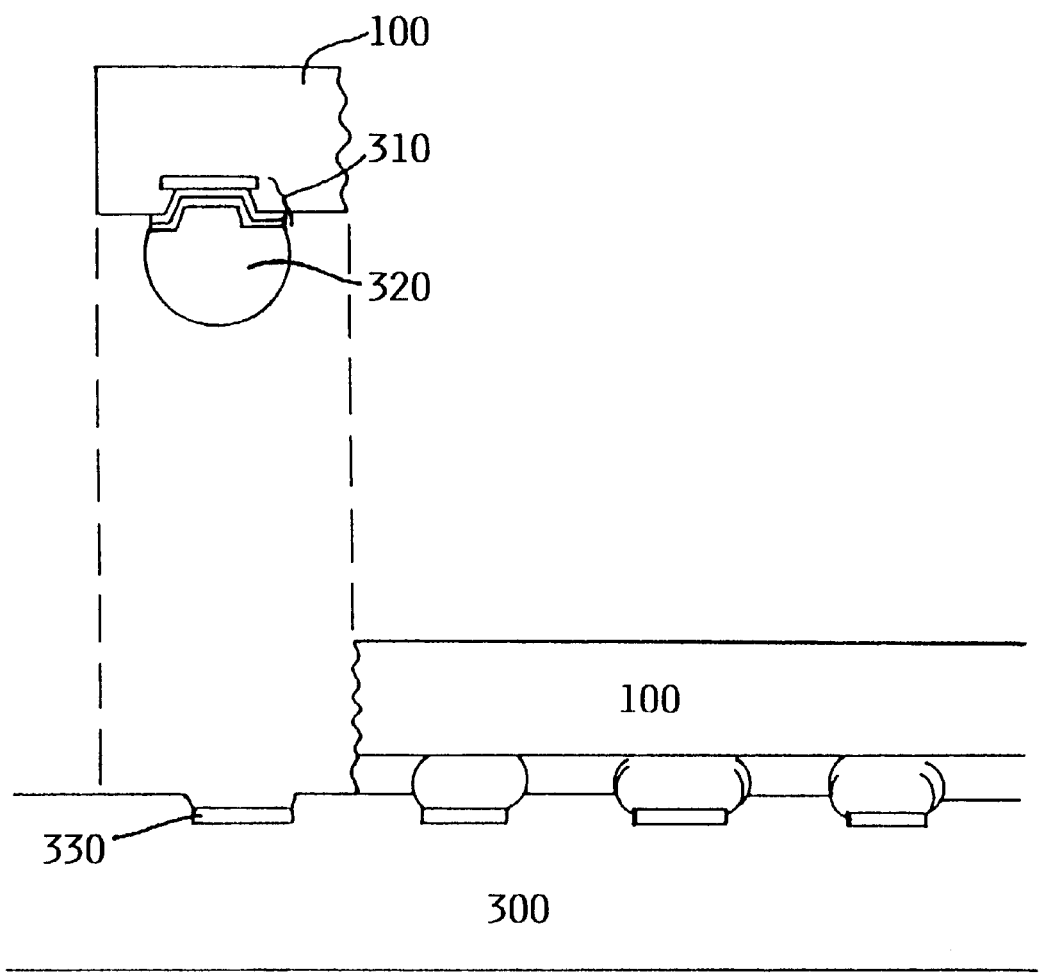
FIG. 3 illustrates a conventional controlled collapse chip connection according to the prior art.

FIG. 2 shows an exemplary C4 flip chip attachment to which is applied an embodiment of the invention. Chip 100 includes an interface region 210, which connects to the chip's circuitry (not shown). A conventional Pb-rich solder bump 220 is deposited on the interface region 210. Carrier substrate 200 includes a standard carrier pad 230 that has a tin (Sn) rich tin-lead (Sn—Pb) surface finish. Conventionally, a connection is formed between chip 100 and carrier substrate 200 by placing the solder bump 220 against the carrier pad 230. In accordance with an aspect of the invention, a thin cap 240 of a metal, such as palladium (Pd) or silver (Ag), is put onto the surface of he conventional C4 Pb rich solder bump structure 220. The cap 240 is created by vapor depositing, sputtering, plating or other suitable methods as would be within the knowledge and skill of one skilled in the art.

The entire structure is heated so that a low melting point liquid composition forms between the capped solder bump 220/240 and carrier pad 230. The structure is cooled, allowing the solder composition to solidify, forming a metallurgical bond that results in both electrical and mechanical connection between the chip 100 and the carrier substrate 200. As would be apparent to one skilled in the art, making a multi-module first level package or a second level package on a card may require subjecting the chip to reflow processing one or more additional times.

When the capped bump 220/240 is used in conjunction with a carrier possessing an Sn/Pb eutectic surface finish, the melting behavior of the C4-to-carrier interconnects is advantageously tailored.

For example, when palladium (Pd) is used as the C4 bump capping material 240, attachment to a carrier which is coated with eutectic solder allows for reflow processing at 200° C. to 230° C. As the carrier pad's eutectic surface finish of the substrate metallurgy 230 melts, it wets the palladium cap material 240. As the palladium dissolves into the molten eutectic solder, the melting point of the palladium alloyed eutectic solder shifts from an invariant 183° C. to a range spanning approximately 220° C. to 260° C. depending on the initial ratio of palladium to lead and tin on both the chip bump 220 and carrier pad surfaces 230. Advantageously, because the liquidus temperature of the alloyed solder can be higher than the temperature used for reflow processing (200° C.–230° C.), the melting range shift provides a more stable bump interconnection when subjected to subsequent heatings in the manufacturing processes.

Moreover, when the chip connections formed by a first reflow process are subjected to additional reflow processes, such as those required to attach modules with chips onto second-level board assemblies, the solidified solder alloy which forms the chip-carrier connection is resistant to complete melting. When additional assembly reflow steps are required, the tailored solder composition will undergo, at most, only a partial melting, with the fraction liquid formed dependent on the temperature used for subsequent assembly, while in some instances, even partial melting can be avoided.

Similar effects can also be provided by using silver (Ag) as the bump capping material.

Preferably, all of the capping material should dissolve into the solder coating to ensure homogeneity and most consistent structural performance of the interconnects.

It is desirable to arrive at an adequate melting temperature range, and preferable solder joint strengths upon complete dissolution of the capping metal off of the solder bump 220 and into the low temperature solder interconnection media present on the carrier pad surfaces 230. For general interconnect process regimens using palladium and silver as bump capping materials in conjunction with the use of Tin-Lead eutectic solder carrier pad coatings the melting temperature range and joint strength can be tailored by controlling the cap 240 thickness.

Take for example, 0.001 inch thick tin-lead eutectic solder composition deposits on 0.004" diameter circular carrier pads 230 that are used to interconnect spherical cap solder bumps 220 with a maximum diameter of approximately 0.0045" and a base diameter of 0.004". With a cap of metal, such as palladium or silver, the bulk solder composition on carrier pads 230 must dissolve approximately 3–3.5% by weight of either palladium or silver to prompt desirable melting range shifts and an increase in liquidus temperature of the interconnect solder after the initial attach.

For this configuration, if the metal capping material 240 is applied so as to cover a 0.002 inch projected diameter spherical shell atop the spherical cap solder bump 220, a uniform coating of metal cap material 240 approximately 25–30 micro-inches thick would be applied if Silver or Palladium is used as the capping material. However, because palladium and silver dissolve into eutectic solder at markedly different rates, different process reflow temperature and time sequences are required, depending on the capping metal used. These process variables are chosen to ensure that sufficient capping material is distributed into the bulk solder pad coating that reflows and forms the interconnect between the carrier pad 230 and the solder bump 220. Because Pd dissolves into eutectic solder at a much slower rate than Ag, a recommended reflow profile for palladium capped bumps should allow for the liquid solder interconnect to be exposed to a sustained minimum peak reflow temperature of 210° C.–215° C. for at least 75 to 90 seconds. For silver capped bumps, both peak temperature and time at or above peak reflow temperature can be reduced, with 30 seconds reflow time at, or above, 200° C.

It will be apparent to one skilled in the art that the manner of making and using the claimed invention has been adequately disclosed in the above-written description of the preferred embodiment(s) taken together with the drawings.

It will be understood that the above described preferred embodiment(s) of the present invention are susceptible to various modifications, changes, and adaptations, and the same are intended to be comprehended within the meaning and range of equivalents of the appended claims.

Further, although a number of equivalent components may have been mentioned herein which could be used in place of the components illustrated and described with reference to the preferred embodiment(s), this is not meant to be an exhaustive treatment of all the possible equivalents, nor to limit the invention defined by the claims to any particular equivalent or combination thereof. A person skilled in the art would realize that there may be other equivalent components presently known, or to be developed, which could be used within the spirit and scope of the invention defined by the claims.

What is claimed is:

1. An integrated circuit chip comprising a solder bump having solder capped with a metal that alters the melting point of the solder when said metal alloyed with said solder.

2. An integrated circuit chip according to claim 1, wherein said integrated circuit chip comprises a flip chip.

3. An assembly of a carrier and an integrated circuit chip according to claim 1, wherein said metal reacts with solder present on said carrier upon heating of the assembly and forms a controlled collapse chip connection between said carrier and said integrated circuit chip upon cooling.

4. An integrated circuit chip according to claim 1, wherein said metal comprises palladium.

5. An integrated circuit chip according to claim 1, wherein said metal comprises silver.

6. An integrated circuit chip according to claim 1, wherein said metal comprises a vapor deposition that is vapor deposited onto the solder bump.

7. An integrated circuit chip according to claim 1, wherein said metal comprises a sputtered layer which is sputtered onto the solder bump.

8. An integrated circuit chip according to claim 1, wherein said metal comprises a plated layer which is plated onto the solder bump.

9. An integrated circuit chip according to claim 1, wherein said solder bump comprises a lead-rich, lead-tin alloy.

10. An integrated circuit chip according to claim 1, wherein said metal comprises a metal that will react with said solder to form an alloy when heated.

11. An integrated circuit chip according to claim 10, wherein said alloy has a higher liquidus temperature than the solder.

12. A method of altering the melting point of solder used in forming a connection between an integrated circuit chip and a carrier substrate comprising: prior to forming the connection to the carrier capping a solder bump of the integrated circuit chip with a metal that alters the melting point of said solder bump after being alloyed with said solder bump during a heating for said connection.

13. A method according to claim 12 where the integrated circuit chip comprises a flip chip.

14. A method according to claim 12 wherein the connection is a controlled collapse chip connection and the method further comprises melting the solder bump capped with metal to form a controlled collapse chip connection.

15. A method according to claim 12, wherein said capping comprises capping with palladium.

16. A method according to claim 12, wherein said capping comprises capping with silver.

17. A method according to claim 12, wherein said capping comprises vapor depositing said metal onto the solder bump.

18. A method according to claim 12, wherein said capping comprises sputtering said metal onto the solder bump.

19. A method according to claim 12, wherein said capping comprises plating said metal onto the solder bump.

20. A method according to claim 12, wherein said solder bump comprises lead.

21. A method according to claim 12, further comprising forming the connection by heating and dissolving said metal into solder to form an alloy.

22. A method according to claim 21, wherein said alloy has a higher melting point than the solder.

23. A method of manufacturing an integrated circuit interconnect comprising:

evaporating solder bumps onto selected locations of an integrated circuit; and capping the solder bumps with a metal that affects the melting point of the solder after being alloyed with the solder by heating.

24. A method of claim 23, wherein said capping comprises capping with palladium.

25. A method of claim 23, wherein said capping comprises capping with silver.

26. A method of interconnecting an integrated circuit with a carrier comprising:
    providing an integrated circuit having solder bumps and a carrier having corresponding pads;
    capping the solder bumps with a layer of metal, which affects the melting point of solder after being alloyed with the solder when heated;
    contacting the capped solder bumps with the corresponding pads;
    heating the integrated circuit and the carrier to the melting point of the solder bumps; and
    cooling the integrated circuit and the carrier.

27. A method according to claim 26, wherein said capping comprises capping with palladium.

28. A method according to claim 26, wherein said capping comprises capping with silver.

* * * * *